United States Patent [19]

Zucker et al.

[11] Patent Number: 4,711,351

[45] Date of Patent: Dec. 8, 1987

[54] APPARATUS FOR STORING ELECTRONIC COMPONENTS

[75] Inventors: Richard S. Zucker, Ellicott City; Philip J. Adinolfi, Columbia, both of Md.

[73] Assignee: Westinghouse Electric Corp., Pittsburgh, Pa.

[21] Appl. No.: 809,702

[22] Filed: Dec. 17, 1985

Related U.S. Application Data

[63] Continuation-in-part of Ser. No. 528,022, Aug. 31, 1983, abandoned.

[51] Int. Cl.$^4$ .......................................... B65D 73/02
[52] U.S. Cl. .................................. 206/331; 206/382; 206/383; 414/266
[58] Field of Search ............... 206/331, 328, 382, 383; 414/266

[56] References Cited

U.S. PATENT DOCUMENTS

| | | | |
|---|---|---|---|
| 2,518,450 | 8/1950 | Cowen et al. | 206/331 |
| 2,998,130 | 8/1961 | Lehner | 206/331 |
| 4,573,574 | 3/1986 | Connery | 206/331 |

Primary Examiner—Joseph Man-Fu Moy
Attorney, Agent, or Firm—W. G. Sutcliff

[57] ABSTRACT

Robotic systems for assembling electronic components require that the components be stored in an orderly manner at locations known to the robot. Generally, it is required that at least two storage locations be provided. More specifically, the components must be stored and presented to the robot in an orderly fashion for assembly operations and a storage location must be provided for components which the robot is unsuccessful in assembling. The invention which is the subject matter of this patent provides a convenient means for storing electronic components having reasonably rigid leads. More specifically, this invention provides for inserting the leads of the components into a semi-rigid gel for purposes of storage. If the components are to be assembled, the robot can conveniently lift the components from the gel. Similarly, if the component cannot be assembled, the robot can store the component by gently inserting the leads of the component into the gel. Alternatively, the gel may be a body of predetermined size for storing multiple components or included in a modular system with each module providing storage for a single component.

3 Claims, 4 Drawing Figures

APPARATUS FOR STORING ELECTRONIC COMPONENTS

CROSS-REFERENCE TO RELATED APPLICATION

This is a continuation-in-part of U.S. patent application Ser. No. 528,022, filed Aug. 31, 1983 now abandoned.

BACKGROUND OF THE INVENTION

Field of the Invention

The invention relates to robotic assembly apparatus and more specifically to apparatus for storing electronic components to be assembled by a robot.

Various techniques have been utilized to present electrical components having leads to a robot for assembly. These techniques range from simple rack-like devices in which the components are positioned in notches or grooves to the conventional feeder tube devices, typically used for integrated circuits. Similarly, various techniques have been used to store components which the robot failed to assemble with a typical technique simply being a storage bin into which the components are dropped. Many of these techniques had the disadvantage that they provided minimum protection to the leads of the component. Additionally, they did not necessarily hold the components in a fixed position while the components were being transported to and from the robot as well as sometimes being rather cumbersome.

SUMMARY OF THE INVENTION

This invention provides apparatus for storing electronic components for use in a robot. With the exception of the resilient gel the subject matter of this application was fully disclosed in U.S. patent application Ser. No. 528,022. Priority is claimed for the previously disclosed subject matter. More specifically, the leads of the stored components are inserted into a gel which holds the components in a semi-rigid position without contaminating the leads such that soldering or other subsequent assembly operations are difficult. Additionally, the gel does not harden and may be reused. Preferably, the gel consists of a mixture of castor oil based isocyanate prepolymer, castor oil based polyol, dimethylpolysiloxane and an ammonia salt based anti-static agent. The preferred mixture consists of approximately 13% Caschem Vorite 715-M1, 66% Caschem Polycin 934-M3, 20% Dow Corning DC-200 (20 cp) and 2% (3-Lauramidopropyl) Triammonia Methylsulfate which serves as an anti-static agent. The gel can be utilized in beds sufficiently large to hold a plurality of components or may be used as a support medium in individual component holders. In the preferred embodiment, the component holders are adapted to be supported by a standardized support rail.

DETAILED DESCRIPTION

Figure 1:
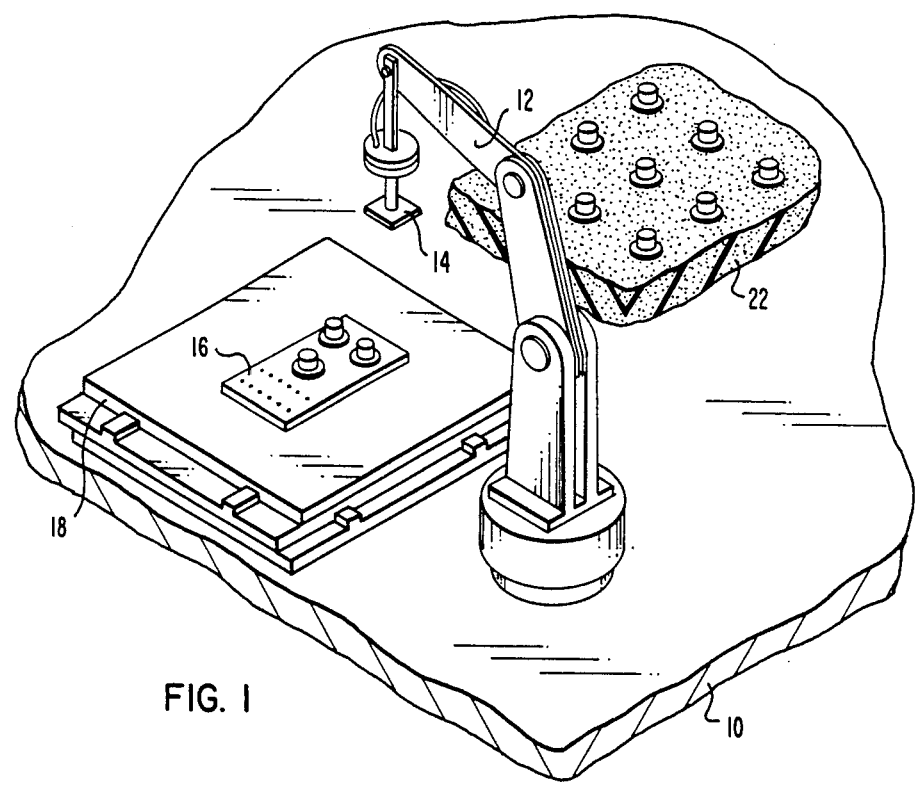
FIG. 1 functionally illustrates a robotic system utilizing component holders of the type which are the subject of this invention.

FIG. 1 illustrates generally a robotic system utilizing the component holders and storage apparatus which is the subject of this invention. The robotic system includes a mounting base 10 on which the robot arm 12 is mounted. Affixed to the end of the robot arm 12 is an end effector 14 specifically designed to handle the electronic components to be assembled.

A circuit board 16 is affixed to an XY table 18 permitting the circuit board 16 to be positioned at a precise location with respect to the robot arm 12. Electronic components to be assembled on the circuit board 16 by the robot arm 12 are stored at a known location as functionally illustrated at reference numeral 22. The support structure 10, robotic arm 12, circuit board 16 and XY table 18 all may be conventional apparatus. Additionally, other prior art means (not illustrated) may be utilized to locate the circuit board 16 with respect to the robot. The purpose of FIG. 1 is to illustrate the working environment of the invention in that the invention comprises a novel means for storing electronic components as functionally illustrated at reference numeral 22 and as described in more detail below.

Figure 2:
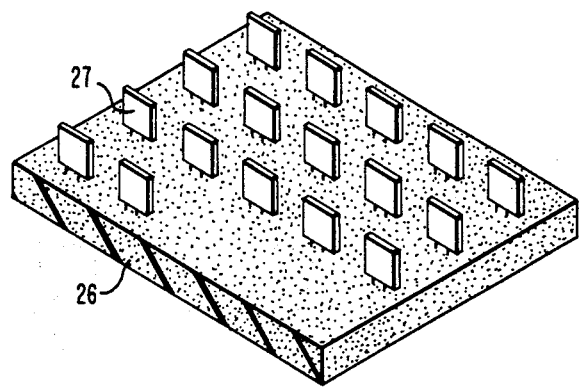
FIG. 2 illustrates another embodiment of the invention.

In its most elementary form, the storage means 22 may consist of nothing more than a bed, layer or body of soft gel-like material as illustrated functionally at reference numeral 26 in FIG. 2. More specifically, this gel-like material preferably consists of a mixture of a castor oil based isocyanate prepolymer, a castor oil based polyol, dimethylpolysiloxane and an ammonia salt anti-static agent. The preferred mixture by weight is approximately 13% Caschem Vorite 715-M1, 66% Caschem Polysin 934-M3, 20% Dow Corning DC-200 (20 cp) and approximately 2% (3-Lauramidopropyl) Triammonia Methylsulfate. The gel is prepared by thoroughly mixing the appropriate quantities of the above agents at room temperature, placing the mixture in a container which acts as a form and curing the material for approximately one hour at 100° C. A typical component having semi-rigid leads is stored by inserting the semi-rigid leads into the gel, as illustrated in FIG. 2.

The dimensions of the layer of gel 26 are selected to accommodate the components to be stored. The thickness of the layer of gel 26 is determined primarily by the length of the leads of the component to be stored. Preferably the layer of gel 26 is sufficiently thick to prevent the leads from penetrating its lower (bottom) surface. The length and width of the gel layer 26 is determined primarily by the size and number of components to be stored. Any convenient means may be used to provide mechanical support for the gel layer 26.

When the gel is prepared using the above materials and procedures, it is semi-rigid, soft and is self-healing in that the leads of the components can be withdrawn and reinserted into the material without destroying the material. Also the gel has the desirable property of remaining soft and retaining its characteristics over long periods of time. Additionally, the gel does not contaminate the leads of the components so as to interfere with soldering and subsequent assembly operations.

Figure 3:
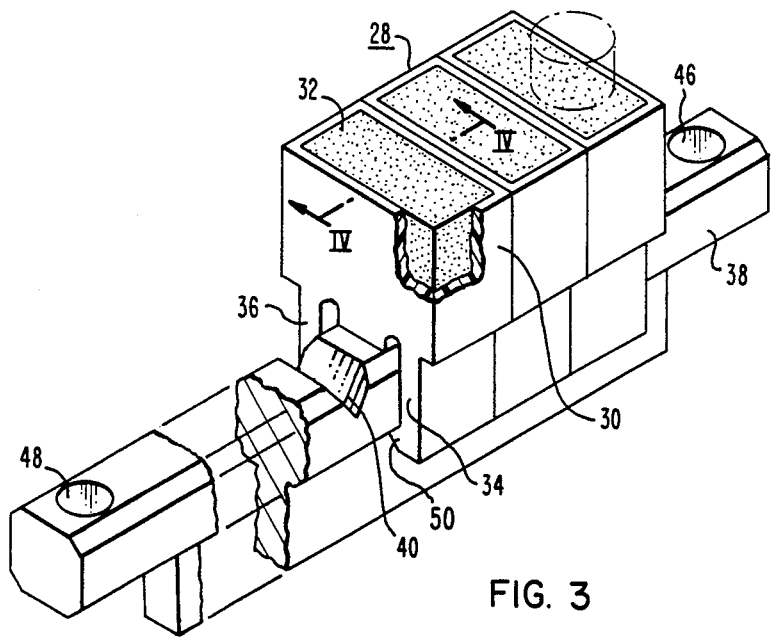
FIG. 3 illustrates another application of the gel material.
Figure 4:
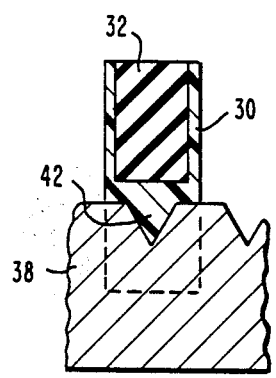
FIG. 4 is a cross-section view of the component holder and the support rail.

Alternatively, each component to be assembled using the robot arm 12 (FIG. 1) may be stored in an individual component holder with a plurality of component holders affixed in a modular fashion to a mounting rail, as illustrated in FIGS. 3 and 4. More specifically, each of the component holders includes a small quantity of gel 32, of the type previously described, into which the leads of the component to be stored are inserted and two opposed downwardly extending resilient members, 34 and 36. Support for the gel 32 is provided by thin edge portions 30 (FIG. 4) which extend around the outer perimeter of the component holder forming a cavity for supporting the gel 32. Each of the resilient members, 34 and 36, also includes an inwardly extending lip near the lower edge 50.

Mounting rail 38 includes an upper portion having a substantially square cross-section and beveled edges. Transverse grooves, with a typical groove illustrated at reference numeral 40, mate with "V"-shaped portion 42 (FIG. 4) of the component holder with the lip portions of resilient members, 34 and 36, extending underneath the lower edge of the upper substantially rectangular portion of mounting rail 38. Mounting holes, 46 and 48, are provided in the ends of the mounting rail 38 permitting the mounting rail 38 and the component holders 28 affixed thereto to be mounted at a known and fixed location with respect to the robot arm 12 (FIG. 1) using a suitable support frame (not illustrated) or other suitable mechanical support apparatus. This permits the robot to acquire components positioned in the component holders 28 and place them on the circuit board 16 (FIG. 1).

If desired, a plurality of mounting rails, of the type illustrated at reference numeral 38, can be mounted on a support frame (not illustrated) to provide any desired number of component storage locations. Other techniques for mechanically supporting the gel at the desired location are also usable. The arrangement illustrated in FIGS. 3 and 4 is advantageous because (1) it is expandable to any convenient size; (2) a portion of the gel can be easily replaced by changing the individual component holders; and (3) component holders utilizing the gel can be intermixed with holders for specialized components which may not be easily adapted for storage using the disclosed gel.

We claim:

1. Apparatus for storing electrical components having semi-rigid leads, comprising a body of resilient gel having a substantially flat upper surface permitting components to be stored by inserting said semi-rigid leads of said electrical components into said gel, and wherein said body of resilient gel has a thickness selected such that the leads of said components do not penetrate through said body of resilient gel, the constituents of said gel being selected such that:
    (1) said semi-rigid leads may be inserted into said gel without substantially bending said semi-rigid leads;
    (2) said gel does not harden or otherwise substantially deteriorate with time; and
    (3) such that said gel does not contaminate said component such that subsequent assembly processes are jeopardized;
   and the gel comprises by weight:
    (a) approximately 13% castor oil based prepolymer;
    (b) approxiamtely 60% castor oil based polyol;
    (c) approximately 20% dimethylpolysiloxane; and
    (d) approximately 2% ammonia salt.

2. Apparatus for supporting the conductive, semi-rigid leads of electrical components and permitting presentation of said components to a robot for assembly on a printed circuit board, which apparatus comprises:
    (a) a plurality of component holders each adapted to support an individual one of said components, each of said plurality of component holders including:
        (i) a base portion with upstanding side wall portions extending upward from the base portion to define an open ended cavity; and
        (ii) at least two opposed resilient members extending downwardly from the base portion and having inwardly extending lip portions at the downwardly extending ends of the resilient members;
    (b) a predetermined quantity of resilient gel disposed within said cavity into which gel the semi-rigid, conductive leads of said components are insertable, which gel thereby supports said leads and the electrical component, and said gel wipes clean from said leads when the leads are withdrawn from the gel and said leads are not contaminated by said gel;
    (c) a support rail upon which said plurality of component holders are supportable with the component holder resilient members engaging on said support rail.

3. The apparatus set forth in claim 2, wherein the gel comprises by weight,
    (1) approximately 13% castor oil based prepolymer;
    (2) approximately 60% castor oil based polyol;
    (3) approximately 20% dimethylpolysiloxane; and
    (4) approximately 2% ammonia salt.

* * * * *